(12) United States Patent
Miyauchi et al.

(10) Patent No.: US 6,621,666 B2
(45) Date of Patent: Sep. 16, 2003

(54) MAGNETORESISTIVE-EFFECT ELEMENT HAVING ELECTRODE LAYERS OPPOSITELY DISPOSED ON MAIN SURFACES OF A MAGNETORESISTIVE-EFFECT THIN FILM HAVING HARD MAGNETIC BIAS LAYERS WITH A PARTICULAR RESISTIVITY

(75) Inventors: Teiichi Miyauchi, Kanagawa (JP); Hiroshi Kano, Kanagawa (JP); Tetsuya Mizuguchi, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 262 days.

(21) Appl. No.: 09/794,003

(22) Filed: Feb. 28, 2001

(65) Prior Publication Data

US 2001/0021089 A1 Sep. 13, 2001

(30) Foreign Application Priority Data

Mar. 2, 2000 (JP) ...................... P2000-061873

(51) Int. Cl.⁷ ................................................ G11B 5/39
(52) U.S. Cl. ................................ 360/324.12; 360/324.2
(58) Field of Search ........................... 360/324.1–324.2

(56) References Cited

U.S. PATENT DOCUMENTS

| | | | | |
|---|---|---|---|---|
| 6,226,160 B1 | * | 5/2001 | Gallagher et al. | ....... 360/324.2 |
| 6,249,407 B1 | * | 6/2001 | Aoshima et al. | ......... 360/324.2 |
| 6,344,954 B1 | * | 2/2002 | Redon et al. | ............ 360/324.2 |
| 6,381,107 B1 | * | 4/2002 | Redon et al. | ............ 360/324.2 |
| 6,451,215 B1 | * | 9/2002 | Shimazawa et al. | .......... 216/22 |
| 6,469,879 B1 | * | 10/2002 | Redon et al. | ............ 360/324.2 |

FOREIGN PATENT DOCUMENTS

JP     11-154309 A   *   6/1999

* cited by examiner

Primary Examiner—Jefferson Evans
(74) Attorney, Agent, or Firm—Rader, Fishman & Grauer PLLC; Ronald P. Kananen, Esq.

(57) ABSTRACT

A first ferromagnetic layer is made to show a single magnetic domain to prevent any magnetic walls from appearing. A pair of bias layers 4 are made of a hard magnetic material showing a high resistivity are arranged at opposite ends of a TMR thin film 3. As a result, the sense current flowing through the TMR thin film 3 is prevented from diverting to the bias layers 4. Thus, a sufficiently strong bias magnetic field can be applied to the TMR thin film 3. As a result, the free layer 13 of the TMR thin film 3 is made to show a single magnetic domain to prevent any magnetic walls from appearing.

8 Claims, 10 Drawing Sheets

MAGNETORESISTIVE-EFFECT ELEMENT HAVING ELECTRODE LAYERS OPPOSITELY DISPOSED ON MAIN SURFACES OF A MAGNETORESISTIVE-EFFECT THIN FILM HAVING HARD MAGNETIC BIAS LAYERS WITH A PARTICULAR RESISTIVITY

BACKGROUND OF THE INVENTION

1. Field of the Invention

This invention relates to a magnetoresistive-effect element comprising a magnetoresistive-effect thin film, a pair of hard magnetic layers formed respectively at opposite ends of the magnetoresistive-effect thin film and electrode layers formed respectively at the sides of the oppositely disposed main surfaces of the magnetoresistive-effect thin film.

2. Related Background Art

Magnetoresistive-effect magnetic heads (to be referred to as MR head hereinafter) adapted to read information signals recorded on a magnetic recording medium, utilizing the magnetoresistive-effect of magnetoresistive-effect thin film (to be referred to as MR thin film hereinafter), are widely used in many high density magnetic recording/reproduction apparatus including hard disk apparatus and magnetic tape apparatus.

Of MR heads, so called shield type MR heads comprising a magnetoresistive-effect element (to be referred to as MR element hereinafter) sandwiched by a pair of magnetic shield member have been finding practical applications.

Various different types of MR thin film are known to date, including one showing the anisotropic magnetoresistive-effect (AMR), one showing the giant magnetoresistive-effect (GMR) and one showing the tunnelling magnetoresistive-effect (TMR).

Of such known various types of MR thin films, MR thin film that utilizes the tunnelling magnetoresistive-effect (to be referred to as TMR thin film hereinafter) comprises a magnetization fixing layer made of an anti-ferromagnetic material, a pin layer made of a ferromagnetic material a tunnel barrier layer made of a nonmagnetic nonconductive material and a free layer made of a ferromagnetic material, said layers being laid sequentially one on the other.

When a sense current is made to flow substantially perpendicularly relative to the TMR thin film, a tunnelling current flows in the tunnel barrier layer and the flow is directed toward from one of the ferromagnetic layer to the other ferromagnetic layer. This phenomenon is referred to as tunnelling junction type magnetoresistive-effect. In an MR element that utilizes TMR thin film (to be referred to as TMR element hereinafter), the magnetization of the free layer changes as a function of the external magnetic field to consequently change the conductance of the tunnelling current. The external magnetic field is detected by observing the conductance of the tunnelling current.

The change in the conductance-of the tunnelling-current is dependent on the relative angle of the two ferromagnetic layers as viewed in the direction of magnetization. In the case of TMR thin film, theoretically the magnetic reluctance ratio of the two ferromagnetic layers can be determined from their respective polarizabilities of magnetization. Thus, TMR elements are attracting attention from the viewpoint of using them for MR heads.

So-called spin valve film is a type of MR thin film utilizing the giant magnetoresistive-effect (to be referred to as GMR thin film hereinafter) and comprises a magnetization fixing layer made of an anti-ferromagnetic material, a pin layer made of a ferromagnetic material, an intermediate layer made of a nonmagnetic nonconductive material and a free layer made of a ferromagnetic material, said layers being laid sequentially one on the other.

When an external magnetic field is applied to a GMR element, the magnetization of the free layer is defined as a function of the direction and the intensity of the applied external magnetic field. The electric resistance of the spin valve layer is maximized when the direction of magnetization of the pin layer and that of the free layer are differentiated from each other by 180° and minimized when they are made same relative to each other. Therefore, the pin valve film changes its electric resistance as a function of the external magnetic field applied to it. Thus, the external magnetic field can be detected by observing the change in the electric resistance.

Meanwhile, for the MR head, it is important to control the magnetic domains and make the free layer of the MR thin film have a single magnetic domain in order to suppress the Barkhausen noise.

An MR head 100 utilizing the anisotropic magnetoresistive-effect or the giant magnetoresistive-effect comprises a lower magnetic shield layer 102a and a lower gap layer 103a laid sequentially on a substrate 101. Then, an MR thin film 104 is formed on the lower gap layer 103a and a pair of bias layer 105, 105 are formed respectively at opposite ends of the MR thin film 104. An upper gap layer 103b and an upper magnetic shield layer 102b are formed on the MR thin film 104 and the bias layers 105, 105.

The free layer of the MR thin film 104 is made to have a single magnetic domain by arranging a pair of bias layers 105, 105 to be used to apply a bias magnetic field to the MR thin film 104 respectively at opposite ends of the MR thin film 104. The bias layers 105, 105 are made of a hard magnetic material that is electrically conductive such as CoPt.

An MR head using a TMR thin film (to be referred to as TMR head hereinafter) comprises a lower magnetic shield layer, a lower gap layer, a TMR thin film, an upper gap layer, an upper magnetic shield layer that are laid sequentially on a substrate. The lower magnetic shield layer, the lower gap layer, the upper gap layer and the upper magnetic shield layer are designed to operate as electrodes.

Then, a sense current is made to flow substantially perpendicularly relative to the film surface of the TMR thin film and the conductance of the tunnelling current that flows through the tunnel barrier layer of the TMR thin film is observed to read the magnetic signal applied to it.

The above described bias layers 105, 105 are made of a hard magnetic material that is electrically conductive such as Co.Pt. Therefore, when bias layers are arranged respectively at opposite ends of the TMR head, the sense current can be diverted into the bias layers to make it difficult to read the magnetic signal applied to it. Because of this reason, in the case of a TMR head, it is not appropriate to control magnetic domains by arranging bias layers respectively at opposite ends of the MR thin film.

In recent years, a GMR head adapted to a so-called CPP (current perpendicular to the plane—to be referred to as CPP-GMR head hereinafter) and formed by arranging a gap layer and a shield layer that are designed to operate as electrode layer as shown in FIGS. 2 and 3 has been proposed as MR head using GMR thin film.

A CPP-GMR head comprises a lower magnetic shield layer, a lower gap layer, a GMR thin film, an upper gap layer and an upper magnetic shield layer that are laid sequentially on a substrate, of which the lower magnetic shield layer, the lower gap layer, the upper gap layer and the upper magnetic shield layer are designed to operate as electrode layers.

Then, a sense current is made to flow substantially perpendicularly relative to the film surface of the GMR thin film and the conductance of the electric current that flows through the intermediate layer of the GMR thin film is observed to read the magnetic signal applied to it.

As pointed out above, a CPP-GMR head is so designed as to make a sense current flow perpendicularly relative to the GMR thin film. Then, the rate of change of the electric current in the CPP-GMR head is larger when it is made to flow perpendicularly relative to the GMR thin film than when it is made to flow in parallel with the GMR thin film. Additionally, since the electrode layers are made to operate as shield layers, it is no longer necessary to electrically insulate the electrode layers and the shield layers if the gap is made narrow and the manufacturing process can be simplified. For theses reasons, CPP-GMR beads have been attracting attention and are getting popularity as magnetic heads.

However, as in the case of a TMR head, when bias layers are arranged respectively at opposite ends of the GMR head, the sense current can be diverted into the bias layers to make it difficult to read the magnetic signal applied to it. Because of this reason, in the case of a CPP-GMR head too, it is not appropriate to control magnetic domains by arranging electrically highly conductive bias layers respectively at opposite ends of the MR thin film.

To solve the above identified problem, a technique of arranging bias layers after forming insulation layers respectively at opposite ends of the MR thin film of a TMR head or a CPP-GMR head has been used. With this arrangement, however, it is no longer possible to apply a sufficiently strong bias magnetic field to the MR thin film to make it difficult to control the magnetic domains of the free layer.

There is also known a technique of arranging bias layers in such a way that they contact only the free layer of the MR thin film. However, this technique is accompanied by the problem as will be discussed hereinafter. Now, a CPP-GMR head where bias layers are arranged so as to contact only the free layer of the MR thin film and the problem that arises from such a head will be discussed.

FIG. 2 schematically illustrates the structure of a CPP-GMR head 111 prepared by using a so-called bottom type GMR thin film 110 where a pin layer is formed at the side of the lower magnetic shield layer and a free layer is formed thereon and also by applying the above technique.

Referring to FIG. 2, the CPP-GMR head 111 comprises a lower magnetic shield layer 113a and a lower gap layer 114a laid sequentially on a substrate 112. Then, a magnetization fixing layer 115, a pin layer 116 and an intermediate layer 117 are formed on the lower gap layer 114a and a pair of nonmagnetic layers 118, 118 are formed respectively at opposite ends of these layers. The nonmagnetic layers 118, 118 are made substantially flush with the intermediate layer 117. Then, a free layer 119 and a protection layer 120 are laid sequentially on the intermediate layer 117 and upwardly tapered. A pair of bias layers 121, 121 are formed respectively at opposite ends of these layers. Then, an upper gap layer 114b and an upper magnetic shield layer 113b are laid sequentially on the protection layer 120 and the bias layers 121, 121.

FIG. 3 schematically illustrates the structure of a CPP-GMR head 131 prepared by using a so-called top type GMR thin film 130 where a free layer is formed at the side of the lower magnetic shield layer and a pin layer is formed thereon and also by applying the above technique.

Referring to FIG. 3, the CPP-GMR head 131 comprises a lower magnetic shield layer 133a and a lower gap layer 134a laid sequentially on a substrate 132. Then, a backing layer 135 and a free layer 136 are laid sequentially on the lower gap layer 134a. A pair of bias layers 137, 137 are formed respectively at opposite ends of these layers. The free layer 136 is made substantially flush with the bias layers 137, 137. Then, an intermediate layer 138, a pin layer 139, a magnetization fixing layer 140 and a protection layer 141 are laid sequentially on the free layer 136. A pair of nonmagnetic layers 142, 142 are formed respectively at opposite ends of theses layers. Then, an upper gap layer 134b and an upper magnetic shield layer 133b are laid sequentially on the protection layer 141 and the nonmagnetic layers 142, 142.

However, with the above arrangement again, the sense current can be diverted into the bias layers 121, 121. Additionally, the productivity is low because of the complicated manufacturing process.

BRIEF SUMMARY OF THE INVENTION

In view of the above identified circumstances of the prior art, it is therefore the object of the present invention to provide a magnetoresistive-effect element comprising a pair of hard magnetic layers formed respectively at opposite ends of the magnetoresistive-effect thin film that can reduce the electric current diverted into the hard magnetic layers if electrode layers are formed oppositely on the main surfaces of the magnetoresistive-effect thin film and operates reliably for signal reproduction.

According to the invention, the above object is achieved by providing a magnetoresistive-effect element comprising a magnetoresistive-effect thin film operating as magnetism sensing section, a pair of hard magnetic layers formed respectively at opposite ends of said magnetoresistive-effect thin film and adapted to apply a bias magnetic field to said magnetoresistive-effect thin film and a pair of electrode layers formed oppositely on the main surfaces of the magnetoresistive-effect thin film and adapted to supply an electric current to said magnetoresistive-effect thin film, said hard magnetic layers having an electric resistivity not lower than 0.5 $\Omega$cm.

A magnetoresistive-effect element according to the invention and having the above described configuration allows little electric current to divert into the hard magnetic layers and makes is possible for the hard magnetic layers to apply a bias magnetic field to the magnetoresistive-effect thin film if a pair of hard magnetic layers are formed respectively at opposite ends of the magnetoresistive-effect thin film and a pair of electrode layers are formed oppositely on the main surfaces of the magnetoresistive-effect thin film.

As pointed out above, a magnetoresistive-effect element according to the invention comprises a pair of hard magnetic layers that are made of a material showing a high electric resistivity. Therefore, if an electric current is made to flow perpendicularly relative to the surface of the magnetoresistive-effect thin film, it is prevented from diverting into the hard magnetic layers.

Additionally, in a magnetoresistive-effect-element according to the invention, a pair of hard magnetic layers are formed directly and respectively at opposite ends of the magnetoresistive-effect thin film. Therefore, it is possible to apply a sufficiently strong bias magnetic field to the first ferromagnetic layer to make it show a single magnetic domain so that any magnetic wall can hardly appear in the element. As a result, the Barkhausen noise can hardly occur and it is possible to detect any weak external magnetic field.

DETAILED DESCRIPTION OF THE INVENTION

Figure 1:
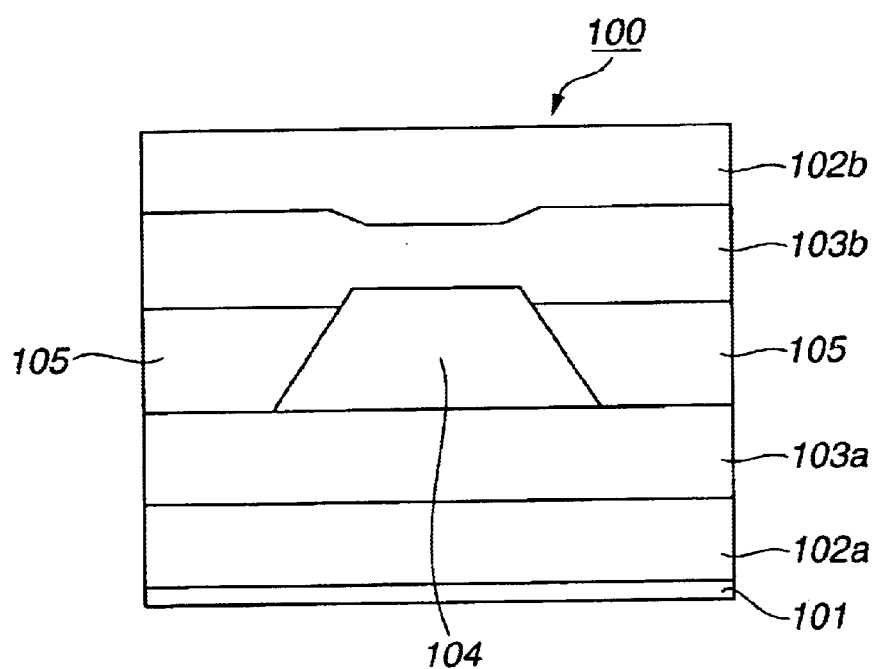
FIG. 1 is an enlarged schematic illustration of a principal part of an MR head comprising an MR element formed by utilizing GMR or AMR.
Figure 2:
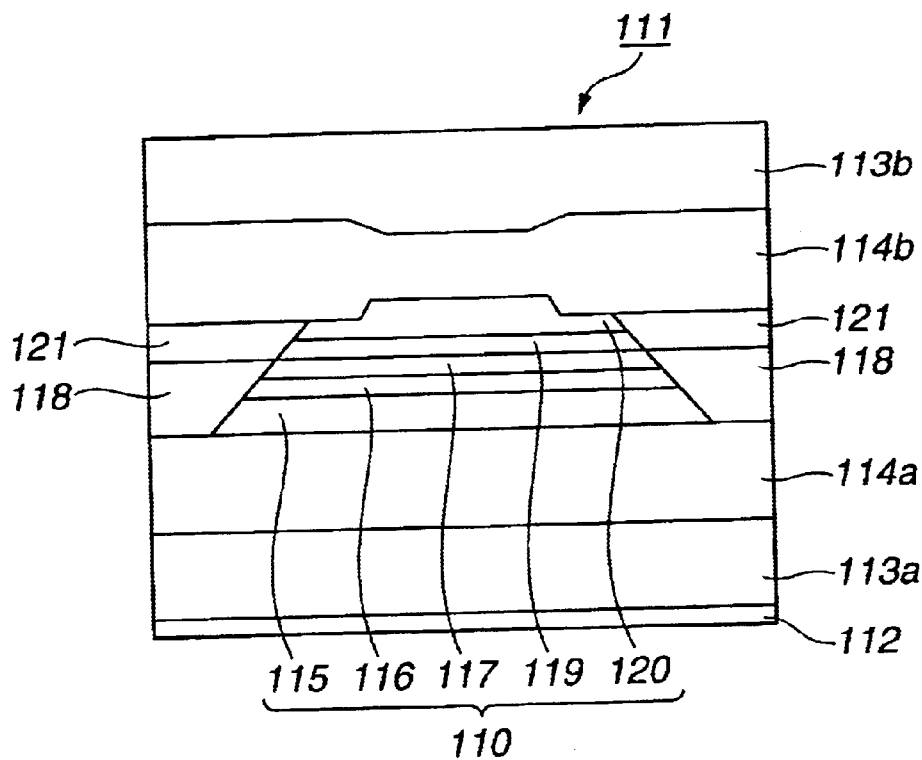
FIG. 2 is an enlarged schematic illustration of a principal part of a CPP-GMR head using a bottom type spin valve film.
Figure 3:
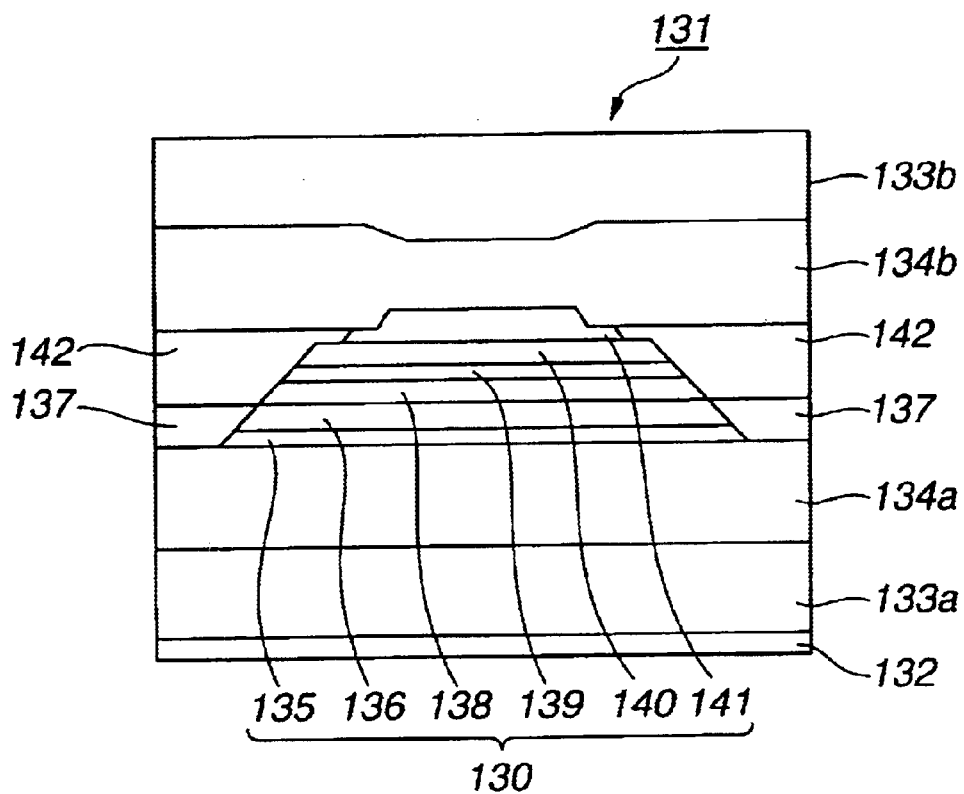
FIG. 3 is an enlarged schematic illustration of a principal part of a CPP-GMR head using a top type spin valve film.
Figure 4:
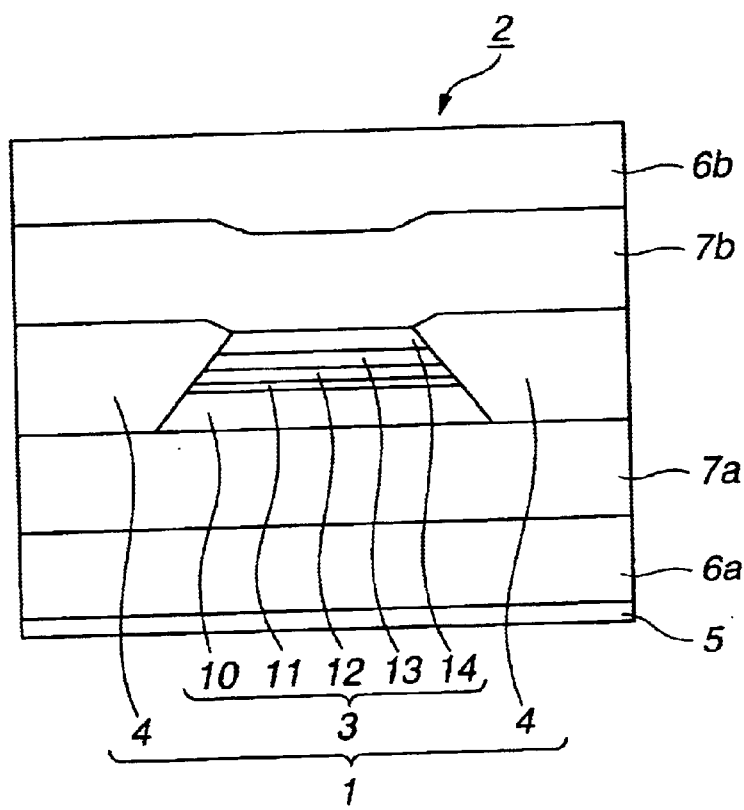
FIG. 4 is an enlarged schematic illustration of a principal part of a TMR head comprising a TMR element to which the present invention is applied.

Now, the present invention will be described in greater detail by referring to the accompanying drawings that illustrate preferred embodiments of the invention. FIG. 4 is an enlarged schematic illustration of a principal part of a magnetoresistive-effect type magnetic head 2 (to be referred to as TMR head 2 hereinafter) comprising a magnetoresistive-effect element 1 (to be referred to as TMR element 1 hereinafter) showing a tunnel junction type magnetoresistive-effect.

Note that the illustrations that are referred to in the following description are mostly enlarged views of a part of the element under consideration that are intended to make the description easily understandable so that the components do not necessarily reflect the real proportions. While the following description is made in terms of the layer arrangement of a TMR head 2, the present invention is by no means limited to the TMR head 2 and the profile and the material of each layer can be appropriately selected according to the application and the desired performance of the head.

Referring to FIG. 4, the TMR element 1 comprises a tunnel junction type magnetoresistive-effect thin film 3 (to be referred to as TMR thin film 3 hereinafter) and a pair of bias layers 4, 4 arranged at opposite ends of the TMR thin film 3.

As shown in FIG. 4, the TMR head 2 comprises a lower magnetic shield layer 6a and a lower gap layer 7a formed on a substrate 5. The TMR element 1 is arranged on the lower gap layer 7a. An upper gap layer 7b and an upper magnetic shield layer 6b are laid sequentially on the TMR element 1.

The TMR thin film 3 is a magnetizm sensing section and senses any external magnetic field. The TMR thin film 3 comprises a magnetization fixing layer 10, a pin layer 11, a tunnel barrier layer 12, a free layer 13 and a protection layer 14 that are laid sequentially one on the other.

The magnetization fixing layer 10 fixes the magnetization of the pin layer 11 by its exchange coupling with the pin layer 11 in detail hereinafter. The magnetization fixing layer 10 is made of anti-ferromagnetic material. Specific examples of materials that can be used for the magnetization fixing layer 10 include RhMn, IrMn, PtMn, NiMn and Fe Mn.

The pin layer 11 fixes the magnetizing-direction of the magnetization fixing layer 10 by its exchange couping. The pin layer 11 is made of a ferromagnetic material. Specific examples of materials that can be used for the pin layer 11 include Co and CoFe.

The tunnel barrier layer 12 provides a site where a tunnel current flows when a sense current is made to flow to the TMR thin film 3. The sense current is made to flow perpendicularly relative to the main surfaces of the TMR thin film 5. The TMR head 2 detects the external magnetic field applied to it by detecting the conductance of the tunnel current.

The tunnel barrier layer 12 is made of a metal material that is nonmagnetic and electrically insulating. Specific examples of materials that can be used for the tunnel barrier layer 12 include $Al_2O_3$ although any appropriate material may be used for the tunnel barrier layer 12 if it allows a tunnelling current to flow therethrough.

The free layer 13 provides a site where the magnetization changes as a function of the external magnetic field applied to it and made of a ferromagnetic material. Specific examples of materials that can be used for the free layer 13 include NiFe and CoFe.

The protection layer 14 prevents the resistivity of the TMR thin film 3 from rising and improves the crystal orientation of the free layer 13. The protection layer 14 is made of a metal material that is nonmagnetic and electrically conductive. Specific examples of materials that can be used for the protection layer 14 include Ta.

The bias layers 4, 4 has the function of reducing the magnetic domains of the free layer 13 of the TMR thin film 3 to a single magnetic domain by applying a bias magnetic field to the TMR thin film 3 and preventing any magnetic wall from appearing. The bias layers 4, 4 are formed at longitudinal opposite ends of the TMR thin film 3 and made of a hard magnetic material showing a high electric resistivity. Preferably, the hard magnetic material shows an electric resistivity not lower than 0.5 Ωcm for the reasons as will be described below.

Figure 5:
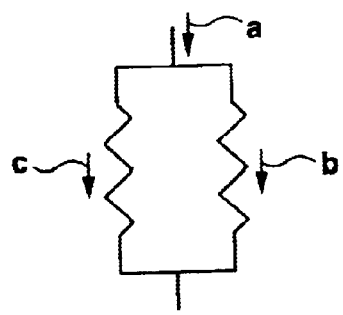
FIG. 5 is a schematic circuit diagram of an equivalent circuit of a sense current flowing through the MR element.
Figure 6:
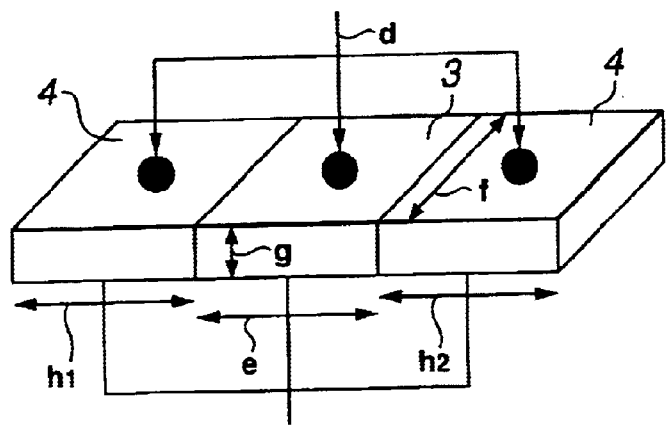
FIG. 6 is a schematic perspective view of the MR element, illustrating the dimensions of the pieces of the thin film and the voltage applied to the MR element.

Firstly, as shown in FIGS. 5 and 6, assume that the intensity of the electric current b that flows through the TMR thin film 3 is I1 when the intensity of the sense current a that is made to flow through the TMR element 1 is I and the resistance of the TMR thin film 3 is R1. Also assume that the intensity of the electric current c that flows through the bias layers 4, 4 is I2 and the resistance of the bias layers 4, 4 is R2. Then, if the level of the voltage d that is applied to the entire TMR element 1 is Vb, formula 1 below holds true.

$$I = I1 + I2 = \frac{Vb}{R1} + \frac{Vb}{R2} \qquad \text{[formula 1]}$$

The ratio of I1 to I is expressed by formula 2 below.

$$\frac{I1}{I} = \frac{\frac{1}{R1}}{\frac{R1+R2}{R1 \times R2}} = \frac{R2}{R1+R2} \qquad \text{[formula 2]}$$

Now, assume that the TMR thin film 3 has a width e of 1 μm, a length f of 1 μm and a thickness g of 40 nm. Also assume that the widths h1, h2 of the bias layers 4, 4 are equal to each other and also to (L2)/2 μm and the resistivity of the bias layers 4, 4 is ρ2 Ωcm. Then, R2 is expressed by formula 3 below.

$$R2 = \rho 2 \times \frac{40 \, \text{nm}}{L2(\mu m)^2} = \rho 2 \times \frac{40 \, \text{nm}}{L2 \times 10^6 (\text{nm})^2} = \rho 2 \times \frac{400}{L2} [\Omega] \qquad \text{[formula 3]}$$

Since it is known that R1 is equal to 30Ω, formula 4 below is obtained by substituting R1 and R2 in formula 1 respectively by 30Ω and the rightmost term of formula 3.

$$\frac{I1}{I} = \frac{\rho 2 \times \frac{400}{L2}}{30 + \rho 2 \times \frac{400}{L2}} \qquad \text{[formula 4]}$$

Since L2 is normally about 10 nm, formula 5 below is obtained by substituting L2 in formula 4 by that value.

$$\frac{I1}{I} = \frac{\rho 2 \times 40}{30 + \rho 2 \times 40} \qquad \text{[formula 5]}$$

Meanwhile, since it is desirable that the sense current applied to the TMR head flows through the TMR element 1 by not less than 40%, the requirement of formula 6 below has to be satisfied.

$$\frac{I1}{I} \geq 0.4 \qquad \text{[formula 6]}$$

From formula 5 and formula 6, it will be seen that formula 7 below holds true.

$$\frac{\rho 2 \times 40}{30 + \rho 2 \times 40} \geq 0.4 \qquad \text{[formula 7]}$$

Formula 8 below is obtained from formula 7.

$$\rho 2 \geq 0.5 \qquad \text{[formula 8]}$$

Thus, the hard magnetic material of the bias layers 4, 4 preferably shows a resistivity not lower than 0.5 Ωcm for the above identified reasons. Note that, for the above formulas, the numerical values of a TMR thin film 3 prepared by sequentially laying PtMn to a thickness of 20 nm for the magnetization fixing layer 10, CoFe to a thickness of 5 nm for the pin layer 11, aluminum oxide to a thickness of 1 nm for the tunnel barrier layer 12, CoFe to a thickness of 4 nm for the free layer 13 and Ta to a thickness of 5 nm for the protection layer 14 on a 5 nm thick Ta substrate are used.

Examples of hard magnetic materials showing a resistivity not lower than 0.5 Ωcm as pointed out above include hard magnetic materials that are oxidized and Co—Fe—MgF$_2$. Of hard magnetic materials that are oxidized and can suitably be used for the purpose of the invention, the use of Fe$_2$O$_3$ or Co-γFe$_2$O$_3$ is most advantageous. If Co—Fe—MgF$_2$ is used, it is preferably laid typically by simultaneous sputtering so as to contain Co by about 35% because a large resistivity of about $10^4$ Ωcm can be obtained when Co—Fe—MgF$_2$ contains Co by about 35%. This value is comparable to that of bias layers 4, 4 made of Co-γFe$_2$O$_3$.

Since the bias layers 4, 4 are made of a material showing a resistivity not less than 0.5 Ωcm, the sense current fed from the lower magnetic shield layer 6a, the upper magnetic shield layer 6b, the lower gap layer 7a and the upper gap layer 7b is prevented from diverting into the bias layers 4, 4.

The substrate 5 is made of a highly hard nonmagnetic material. Specific examples of materials that can be used for the substrate 5 include alumina-titanium-carbide (altic). The substrate 5 is made to show the profile of a substantially rectangular thin plate.

The lower magnetic shield layer 6a and the upper magnetic shield layer 6b (to be referred to as magnetic shield layers 6, 6 hereinafter) operate to prevent any signal magnetic fields coming from the magnetic recording medium other than the one to be reproduced from being drawn into the TMR thin film 3. In other words, any signal magnetic fields other than the one to be reproduced are led to the magnetic shield layers 6, 6 and only the signal magnetic field to be reproduced is led to the TMR thin film 3. As a result, the high frequency performance characteristics and the reading resolution of the TMR thin film 3 are significantly improved. Note that the magnetic shield layers 6, 6 also operate as electrode layers for feeding a sense current to the TMR thin film 3.

The magnetic shield layers 6, 6 are made of an electrically conductive soft magnetic material. Examples of materials that can be used for the magnetic shield layers 6, 6 include Permalloy, CoZrTa, CoNbTa and sendust (Fe—Al—Si alloy).

The lower gap layer 7a and the upper gap layer 7b (to be referred to as gap layers 7, 7 hereinafter) are realized in the form of thin films made of an electrically nonconductive nonmagnetic material. The provision of the gap layers 7, 7 maintains the insulation of the magnetic shield layers 6, 6 and the TMR thin film 3 relative to each other. The gap layers 7, 7 and the magnetic shield layers 6, 6 operate as electrode layers for supplying a sense current to the TMR thin film 3.

The gap layers 7, 7 are made of an electrically conductive nonmagnetic material. Specific examples of materials that can be used for the gap layers 7, 7 include Ta, Cu, Cr, Ti and W.

The TMR element 1 is adapted to detect an external magnetic field, utilizing the phenomenon that the conductance of the tunnelling current flowing through the tunnel barrier layer 12 changes as a function of the relative angle of magnetization between the pin layer 11 and the free layer 13 of the MR thin film 6. The principle underlying the detection of an external magnetic field will be discussed below.

The direction of magnetization of the pin layer 11 is fixed and that of the free layer 13 is freely variable. A sense current is made to flow through the TMR element 1 in a direction perpendicular to the TMR thin film 3. As an external magnetic field is applied to the TMR element 1, the direction of magnetization of the free layer 13 is changed relative to that of the pin layer 11 to consequently change the conductance of the tunnelling current flowing through the tunnel barrier layer 12. Therefore, the external magnetic field can be detected by observing the change in the conductance of the tunnelling current.

The TMR head 2 is adapted to reproduce the information recorded on a recording medium such as a magnetic recording medium by detecting the external magnetic field.

As may be clear from the above description, the sense current deviating to the bias layers 4, 4 of the TMR element 1 can be reduced since the bias layers 4, 4 are made of a material showing a resistivity not less than 0.5 $\Omega$cm.

Additionally, since the bias layers 4, 4 are made of a hard magnetic material and arranged at opposite ends of the TMR thin film 3 of the TMR element 1, it is possible to sufficiently apply a bias magnetic field to the free layer 13. Then the free layer 13 is made to show a single magnetic domain and hardly produce any magnetic wall. Thus, the TMR element 1 can prevent Barkhausen noise from occurring.

Figure 7:
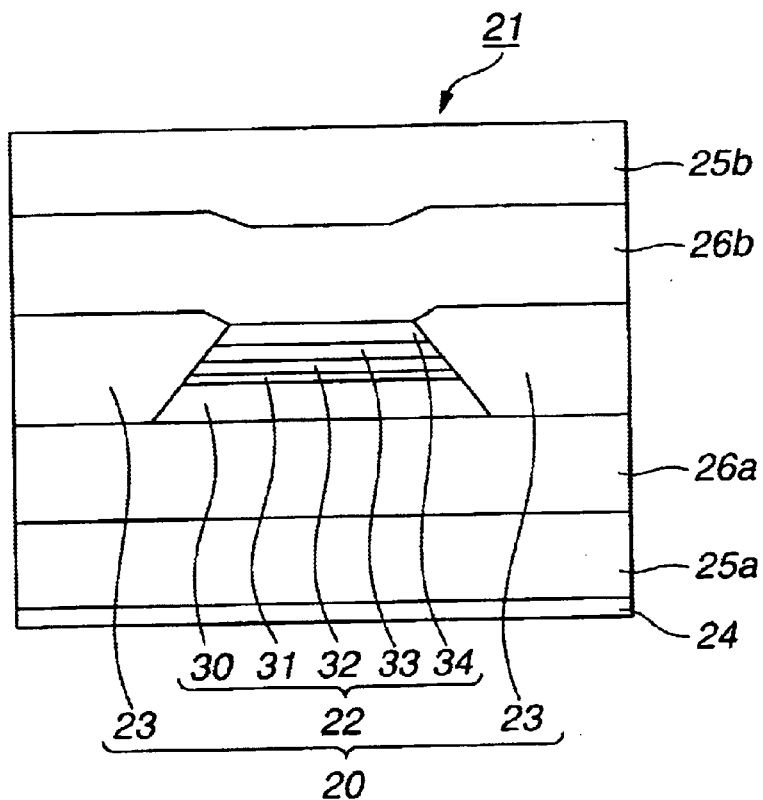
FIG. 7 is an enlarged schematic illustration of a principal part of a GMR head comprising a GMR element to which the present invention is applied.

Now, as shown in FIG. 7, a magnetoresistive-effect type magnetic head 21 (to be referred to as CPP-GMR head 21 hereinafter) comprising a magnetoresistive-effect element 20 showing a giant magnetoresistive-effect (to be referred to as GMR element 20 hereinafter), where a sense current is made to flow in a direction perpendicular to the GMR thin film, will be described.

Referring to FIG. 7, the GMR element 20 comprises a spin valve film 22 and a pair of bias layers 23, 23 arranged respectively at opposite ends thereof.

As shown in FIG. 7, the CPP-GMR head 21 comprises a lower magnetic shield layer 25a and a lower gap layer 26a laid sequentially on a substrate 24. Then, a GMR element 20 is formed on the lower gap layer 26a. An upper gap layer 26b and an upper magnetic shield layer 25b are laid sequentially on the GMR element 20.

The spin valve film 22 is a magnetism sensing section adapted to sense any external magnetic field. The spin valve film 22 comprises a magnetization fixing layer 30, a pin layer 31, an intermediate layer 32, a free layer 33 and a protection layer 34 laid sequentially one on the other.

The magnetization fixing layer 30 fixes the magnetization of the pin layer 31 by its exchange coupling with the pin layer 31 as will be discussed in greater detail hereinafter. The magnetization fixing layer 30 may be a single layer film or a multilayer film of an anti-ferromagnetic material or made of an alloy. Specific examples of materials that can be used for the magnetization fixing layer 30 include RhMn, IrMn, PtMn, NiMn, FeMn and PtPdMn.

The direction of magnetization of the pin layer 31 is fixed as a result of its exchange coupling with the magnetization fixing layer 30. The pin layer 31 may be a single layer film or a multilayer film of a ferromagnetic material or made of an alloy. Specific examples of materials that can be used for the pin layer 31 include Co, Fe, Ni, Cu, Ru, CoFe and NiFe.

The intermediate layer 32 electrostatically couples the pin layer 31 and the free layer 32. As the intermediate layer 32 is formed, a giant magnetoresistive-effect appears in the spin valve film 22. The intermediate layer 32 may be a single layer film or a multilayer film of an electrically conductive nonmagnetic material or made of an alloy. Specific examples of materials that can be used for the intermediate layer 32 include Cu, Ni, Cr and Ru.

The free layer 33 provides a site where the magnetization changes as a function of the external magnetic field applied to it. The free layer 33 may be a single layer film or a multilayer film of a ferromagnetic material or made of an alloy. Specific examples of materials that can be used for the free layer 33 include NiFe, CoFe, Co, Fe, Ni, Cu and Ru.

The protection layer 34 prevents the resistivity of the spin valve film 22 from increasing. It also improves the crystal orientation of the free layer 33. The protection layer 34 may be a single layer film or a multilayer film of a metal material that is electrically nonmagnetic nonconductive or made of an alloy. Specific example of materials that can be used for the protection layer 34 include Ti, Cr, Ta, Mo, $TiN_2$ and NiFe.

While the spin valve film 22 is described above as a bottom type pin valve film having a pin layer arranged near the substrate and a free layer arranged thereabove with an intermediate layer interposed therebetween. However, it may alternatively be a top type spin valve film having a free layer arranged near the substrate and a pin layer arranged thereabove with an intermediate layer interposed therebetween.

The bias layers 23, 23 have a function of applying a bias magnetic field to the spin valve film 22 to reduce the magnetic domains of each of the ferromagnetic layers of the spin valve film 22 into a single magnetic domain and prevent any magnetic wall from appearing.

The bias layers 23, 23 are arranged at longitudinal opposite ends of the spin valve film 22 and made of a hard magnetic material showing a high resistivity. The hard magnetic material preferably shows a resistivity not lower than 0.5 $\Omega$cm for reasons same as those pointed out earlier when describing the bias layers 4, 4 of a TMR head 2.

As discussed earlier when described the bias layers 4, 4, hard magnetic materials showing a resistivity not less than 0.5 $\Omega$cm that can be used for the bias layers 23, 23 include oxidized hard magnetic materials and Co—Fe—$MgF_2$. Oxidized hard magnetic materials that can preferably be used for the bias layers 23, 23 include $Fe_2O_3$ and Co-$\gamma Fe_2O_3$. If Co—Fe—$MgF_2$ is used, it is preferably laid typically by simultaneous sputtering so as to contain Co by about 35% because a large resistivity of about $10^4$ $\Omega$cm can be obtained when Co—Fe—MgF$_2$ contains Co by about 35%. This value is comparable to that of bias layers 4, 4 made of Co-γFe$_2$O$_3$.

Since the bias layers 23,23 of the GMR head 21 are made of a material showing a high resistivity like the bias layers 4,4 of the above described TMR head 2, the sense current fed from the magnetic shield layers 25, 25 and the gap layers 26, 26 is prevented from diverting into the bias layers 23, 23.

The lower magnetic shield layer 25a and the upper magnetic shield layer 25b (to be referred to as magnetic shield layers 25, 25 hereinafter) operate to prevent any signal magnetic fields coming from the magnetic recording medium other than the one to be reproduced from being drawn into the spindle valve film 22. In other words, any signal magnetic fields other than the one to be reproduced are led to the magnetic shield layers 25, 25 and only the signal magnetic field to be reproduced is led to the spindle valve film 22.

As a result, the high frequency performance characteristics and the reading resolution of the spindle valve film 22 are significantly improved. Note that the magnetic shield layers 25, 25, also operate as electrode layers for feeding a sense current to the spindle valve film 22.

The magnetic shield layers 25, 25 are made of an electrically conductive soft magnetic material. Examples of materials that can be used for the magnetic shield layers 25, 25 include Permalloy, CoZrTa, CoNbTa and sendust (Fe—Al—Si alloy).

The lower gap layer 26a and the upper gap layer 26b (to be referred to as gap layers 26, 26 hereinafter) are realized in the form of thin films made of an electrically nonconductive nonmagnetic material. The provision of the gap layers 26,26 maintains the insulation of the magnetic shield layers 25, 25 and the spindle valve film 22 relative to each other. The gap layers 26, 26 and the magnetic shield layers 25, 25 operate as electrode layers for supplying a sense current to the spindle valve film 22.

The gap layers 26 may be a single layer film or a multilayer film of an electrically conductive nonmagnetic material or made of an alloy. Specific examples of materials that can be used for the gap layers 26, 26 include Ta, Cu, Cr, Mo, TiN$_2$ and NiFe. The gap layers 26, 26 may have a multilayer structure realized by laying some of the above listed materials one on the other.

The GMR element 20 is adapted to detect an external magnetic field, utilizing the phenomenon that the conductance of the sense current flowing through the spindle valve film 22 changes as a function of the relative angle of magnetization between the pin layer 31 and the free layer 33 of the spindle valve film 22. The principle underlying the detection of an external magnetic field will be discussed below.

The direction of magnetization of the pin layer 31 is fixed and that of the free layer 33 is freely variable. A sense current is made to flow through the GMR element 20 in a direction perpendicular to the spindle valve film 22. As an external magnetic field is applied to the GMR element 20, the direction of magnetization of the free layer 33 is changed relative to that of the pin layer 31 to consequently change the conductance of the sense current flowing through the spindle valve film layer 32. Therefore, the external magnetic field can be detected by observing the change in the conductance of the sense current.

The GMR head 21 is adapted to reproduce the information recorded on a recording medium such as a magnetic recording medium by detecting the external magnetic field.

As may be clear from the above description, the sense current deviating to the bias layers 23, 23 of the GMR element 20 can be reduced since the bias layers 23, 23 are made of a material showing a high resistivity.

Additionally, since the bias layers 23, 23 are made of a hard magnetic material and arranged at opposite ends of the spindle valve film 22 of the GMR element 20, it is possible to sufficiently apply a bias magnetic field to the free layer 31. Then the free layer 31 is made to show a single magnetic domain and hardly produce any magnetic wall. Thus, the GMR element 20 can prevent Barkhausen noise from occurring.

Now, a method of manufacturing a TMR element 1 that can be used for the purpose of the invention will be described by referring to FIGS. 8 through 12. Note that, as in the case of FIGS. 4 through 9, the illustrations that are referred to in the following description are mostly enlarged views of a part of the element under consideration that are intended to make the description easily understandable so that the components do not necessarily reflect the real proportions.

While the following description on the method of manufacturing a TMR element 1 is made in terms of a specific example where the TMR element 1 is applied to a TMR head 2, it should be noted the present invention is by no means limited thereto.

Figure 8:
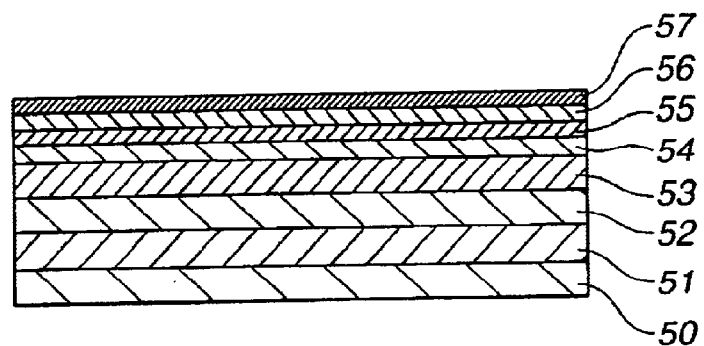
FIG. 8 is a schematic illustration of a method of manufacturing a TMR head to which the present invention is applied, showing the layers up to the nonmagnetic metal layer.

Firstly, referring to FIG. 8, a first magnetic layer 51 that eventually makes a lower shield layer 6a and a first nonmagnetic layer 52 that eventually makes a lower gap layer 7a are formed sequentially on a substrate material 50 that eventually makes a substrate 5 by sputtering.

Then, a TMR thin film 3 is formed on the first nonmagnetic layer 52. More specifically, an anti-ferromagnetic layer 53 that eventually makes a magnetization fixing layer 10, a first ferromagnetic layer 54 that eventually makes a pin layer 11, a nonmagnetic nonconductive layer 55 that eventually makes a tunnel barrier layer 12, a second ferromagnetic layer 56 that eventually makes a free layer 13 and a nonmagnetic metal layer 57 that eventually makes a protection layer 14 are sequentially formed by sputtering.

Figure 9:
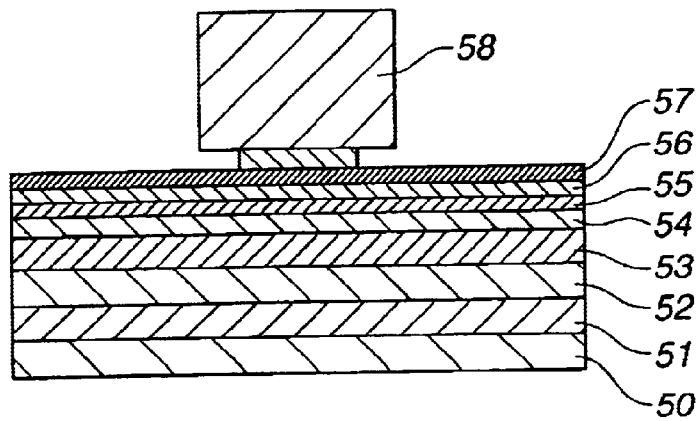
FIG. 9 is a schematic illustration of the method of manufacturing a TMR head, showing the step where photoresist is laid on the nonmagnetic layer.
Figure 10:
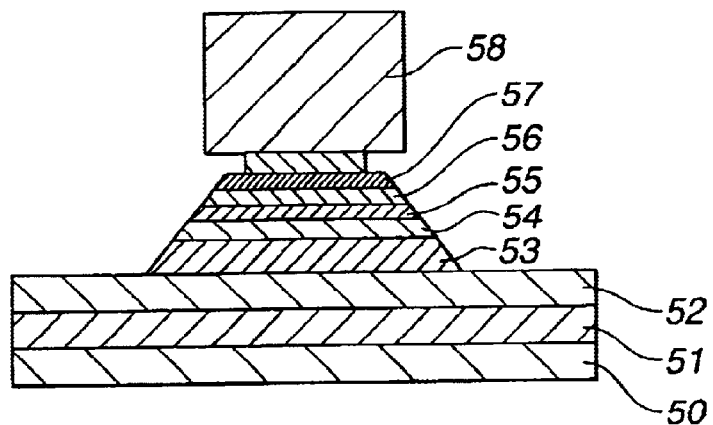
FIG. 10 is a schematic illustration of the method of manufacturing a TMR head, showing the step where the TMR thin film is subjected to an etching operation.

Then, referring to FIG. 9, photoresist 58 is laid on the nonmagnetic metal layer 57 and an etching operation is conducted until the first nonmagnetic layer 52 becomes exposed as shown in FIG. 10.

Figure 11:
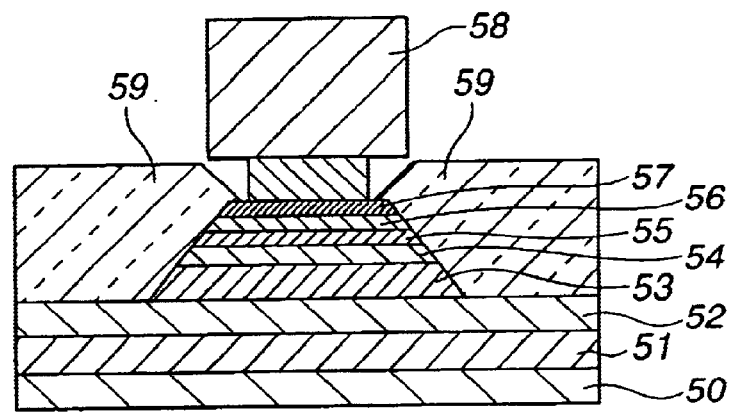
FIG. 11 is a schematic illustration of the method of manufacturing a TMR head, showing the step where the hard magnetic layers are formed.
Figure 12:
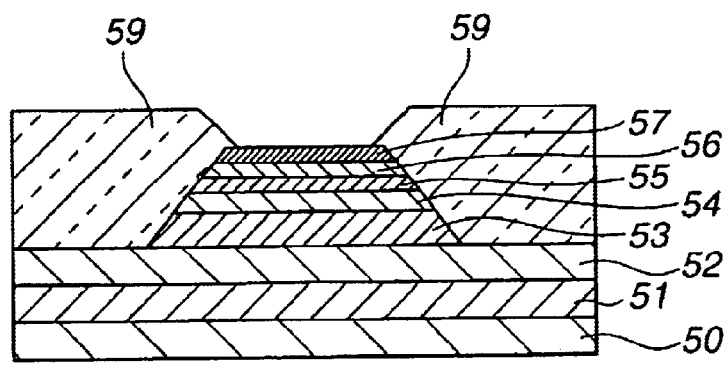
FIG. 12 is a schematic illustration of the method of manufacturing a TMR head, showing the step where the photoresist is removed.

Then, as shown in FIG. 11, a pair of hard magnetic layers 59, 59 that eventually make bias layers 4, 4 are formed on the first nonmagnetic layer 52 that is exposed as a result of the etching operation. Thereafter, the photoresist 58 is removed by means of a lift-off technique as shown in FIG. 12.

Finally, a second magnetic layer that eventually makes an upper magnetic shield layer 6b and a second nonmagnetic layer that eventually makes an upper gap layer 7b are formed sequentially by sputtering to produce a finished TMR head 2 as shown in FIG. 4.

Note that the electric resistance of the hard magnetic layer 59 is greater than that of the TMR thin film 3. Therefore, no problem arises if the second magnetic layer is formed off the nonmagnetic metal layer 57 and on the hard magnetic layer 59. Thus, the second magnetic layer does not require any rigorous alignment operation in the process of manufacturing the TMR head 2.

Now, a method of manufacturing a GMR element 20 that can be used for the purpose of the invention will be described by referring to FIGS. 13 through 17. Note that, as in the case of FIGS. 4 through 12, the illustrations that are referred to in the following description are mostly enlarged views of a part of the element under consideration that are intended to make the description easily understandable so that the components do not necessarily reflect the real proportions.

Figure 13:
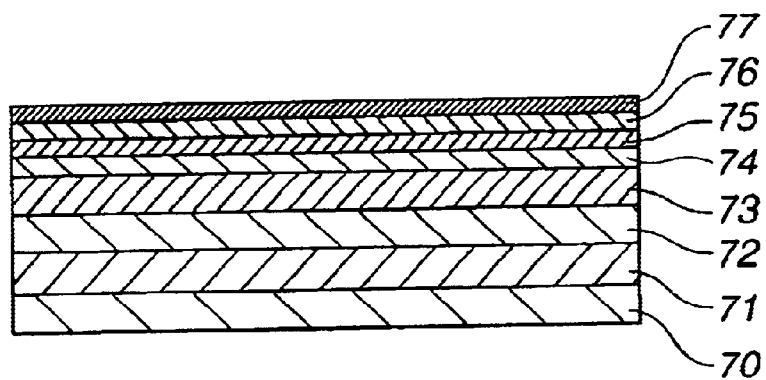
FIG. 13 is a schematic illustration of a method of manufacturing a GMR head to which the present invention is applied, showing the layers up to the nonmagnetic metal layer.

Firstly, referring to FIG. 13, a first magnetic layer 71 that eventually makes a lower shield layer 25a and a first nonmagnetic layer 72 that eventually makes a lower gap layer 26a are formed sequentially on a substrate material 70 that eventually makes a substrate 24 by sputtering.

Then, a spin valve film 22 is formed on the first nonmagnetic layer 72. More specifically, an anti-ferromagnetic layer 73 that eventually makes a magnetization fixing layer 30, a first ferromagnetic layer 74 that eventually makes a pin layer 31, a nonmagnetic nonconductive layer 75 that eventually makes a tunnel barrier layer 32, a second ferromagnetic layer 76 that eventually makes a free layer 33 and a nonmagnetic metal layer 77 that eventually makes a protection layer 34 are sequentially formed by sputtering.

Figure 14:
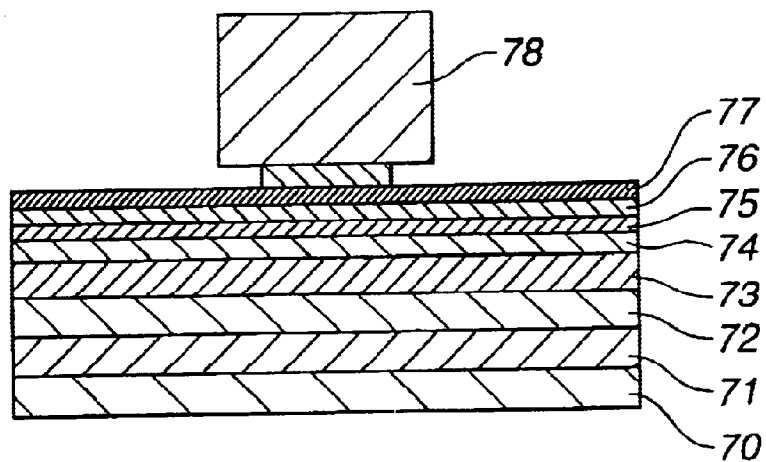
FIG. 14 is a schematic illustration of the method of manufacturing a GMR head, showing the step where photoresist is laid on the nonmagnetic layer.
Figure 15:
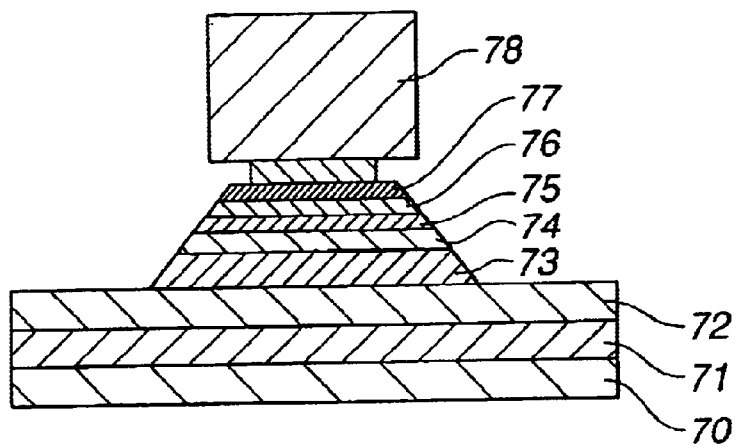
FIG. 15 is a schematic illustration of the method of manufacturing a GMR head, showing the step where the spin valve film is subjected to an etching operation.

Then, referring to FIG. 14, photoresist 78 is laid on the nonmagnetic metal layer 77 and an etching operation is conducted until the first nonmagnetic layer 72 becomes exposed as shown in FIG. 15.

Figure 16:
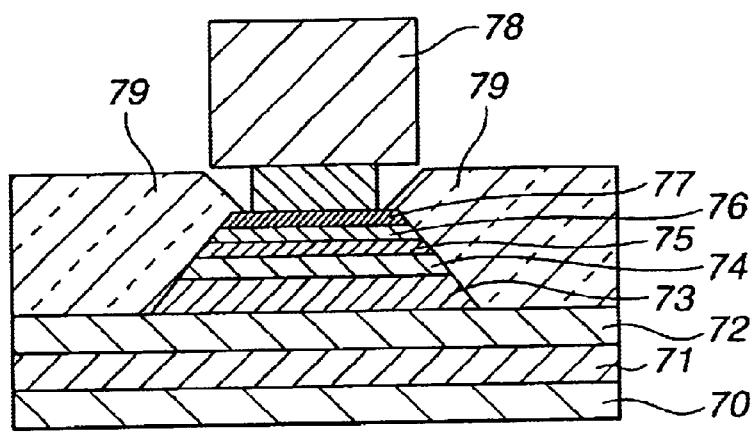
FIG. 16 is a schematic illustration of the method of manufacturing a GMR head, showing the step where the hard magnetic layers are formed.
Figure 17:
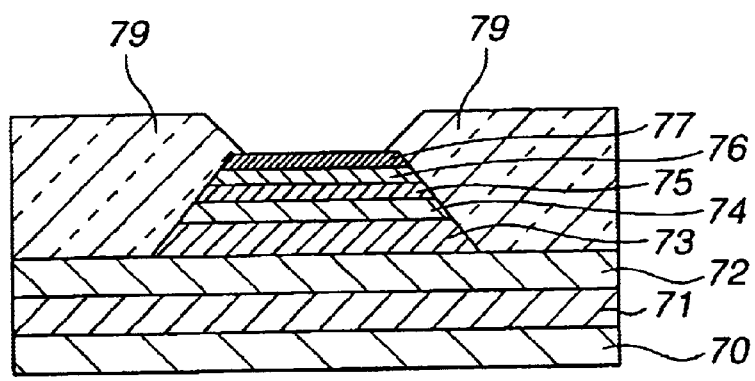
FIG. 17 is a schematic illustration of the method of manufacturing a GMR head, showing the step where the photoresist is removed.

Then, as shown in FIG. 16, a pair of hard magnetic layers 79, 79 that eventually make bias layers 23, 23 are formed on the first nonmagnetic layer 72 that is exposed as a result of the etching operation. Thereafter, the photoresist 78 is removed by means of a lift-off technique as shown in FIG. 17.

Finally, a second magnetic layer that eventually makes an lower magnetic shield layer 25b and a second nonmagnetic layer that eventually makes an lower gap layer 26b are formed sequentially on the nonmagnetic metal layer 77 and the hard magnetic layers 79, 79 by sputtering to produce a finished GMR head 21 as shown in FIG. 5.

Note that the electric resistance of the hard magnetic layer 79 is greater than that of the spin valve film 22. Therefore, no problem arises if the second magnetic layer is formed off the nonmagnetic metal layer 77 and on the hard magnetic layer 79. Thus, the second magnetic layer does not require any rigorous alignment operation in the process of manufacturing the GMR head 21.

As may be clear from the above description, the bias layers 4, 4 of the TMR element 1 are made of a material showing a high electric resistivity and therefore can prevent the sense current from diverting into the bias layers 4, 4. Additionally, since the pair of bias layers 4, 4 that are made of a hard magnetic material are arranged at opposite ends of the TMR thin film 3 of the TMR element 1, it is possible to apply a sufficiently bias magnetic field to the free layer 13. As a result, the free layer is made to show a single magnetic domain and any magnetic wall can hardly appear there. Therefore, the TMR element 1 is practically free from Barkhausen noise and hence can detect any minute external magnetic field.

Similarly, the bias layers 23, 23 of the GMR element 20 are made of a material showing a high electric resistivity and therefore can prevent the sense current from diverting into the bias layers 23, 23. Additionally, the GMR element 20, since the pair of bias layers 23, 23 are made of a hard magnetic material, it is possible to apply a sufficiently strong magnetic field to the free layer 33. As a result, the free layer 33 is made to show a single magnetic domain and any magnetic wall can hardly appear there. Therefore, the GMR element 20 is practically free from Barkhausen noise and hence can detect any minute external magnetic field.

EXAMPLES

Now, the change of magnetization of an MR element according to the invention relative to an external magnetic field will be discussed by way of an examples.

Example 1

The change of magnetization of a TMR element according to the invention in response to an external magnetic field will be described.

Firstly, a Permalloy film was formed to a thickness of 5 $\mu$m on a wafer to be used as substrate by means of a plating technique. Then, a Ta film was formed to a thickness of 70 nm by means of a sputtering technique.

Thereafter, layers that eventually produce a TMR thin film were formed. Firstly, an RhMn film, a Co film and an Al film were formed sequentially to respective thicknesses of 30 nm, 2 nm and 0.8 nm by means of a sputtering technique. Then, the layers were left in the atmosphere for 10 hours. As a result, the Al film layer became an $Al_2O_3$ film layer. Thereafter, an $Ni_{80}Fe_{20}$ film and a Ta film were formed sequentially to respective thicknesses of 5 nm and 0.5 nm on the $Al_2O_3$ film by means of a sputtering technique.

Subsequently, the TMR thin film was subjected to an etching process and an ion milling process to remove partly it at opposite ends and make the TMR thin film show a predetermined profile.

Then, Co-$\gamma Fe_2O_3$ films were formed at the respective opposite ends of the TMR thin film to a thickness of 30 nm by means of a DC sputtering system. The free layer could be satisfactorily stabilized when the Co-$\gamma Fe_2O_3$ films were made to show a thickness of 30 nm. A $Co_{20}Fe_{60}$ alloy was used as target and Ar-10% $O_2$ gas was used under pressure of 0.5 Pa as sputtering gas. High frequency power of 500 W was applied for the film forming operation.

Thereafter, a Ta film was formed to a thickness of 100 nm by means of a lift-off technique and then an $Al_2O_3$ film was formed in the areas other than the TMR element. As a result, it was possible to prevent short-circuiting from occurring in the magnetic shield layers. Then, an $Ni_{80}Fe_{20}$ film was formed to a thickness of 5 $\mu$m by means of a plating technique. Finally, the work was heat-treated at 270° C. in the atmosphere for an hour. As a result, the magnetic characteristics of the Co-$\gamma Fe_2O_3$ were remarkably improved.

Figure 18:
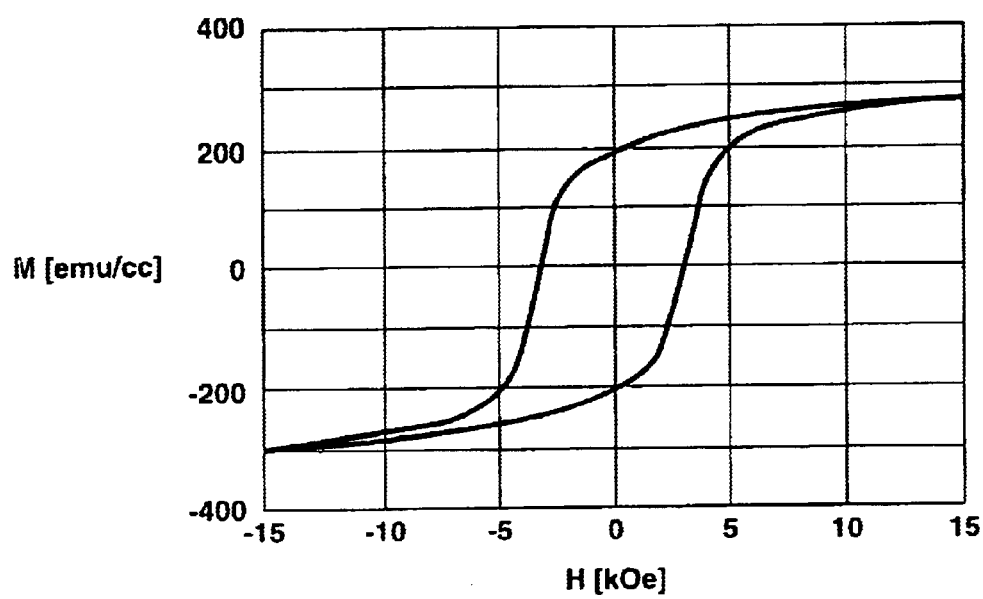
FIG. 18 is a graph illustrating the relationship between the external magnetic field and the magnetization of the recording medium when signals are reproduced from the recording medium by means of a TMR head to which the present invention is applied.

A sense current was made to flow from the lower magnetic shield layer toward the upper magnetic shield layer of the TMR head to observe the relationship between the external magnetic field and the magnetization of the free layer by means of an oscillating specimen type fluxmeter. FIG. 18 shows the obtained result. As seen from FIG. 18, a satisfactory hysteresis curve was obtained.

From the above result, it was found that the sense current is hardly diverted into the bias layers of a TMR head according to the invention and that it can effectively utilize the change in the magnetic resistance of the TMR element. Additionally, it was found that, since the free layer of the TMR thin film of a TMR head according to the invention shows a satisfactory single magnetic domain and can hardly give rise to any magnetic wall, the TMR head operates excellently for signal reproduction.

Example 2

The change of magnetization of a GMR element according to the invention in response to an external magnetic field will be described.

Firstly, a Permalloy film was formed to a thickness of 5 $\mu$m on a wafer to be used as substrate by means of a plating technique. Then, a Ta film was formed to a thickness of 5 nm by means of a sputtering technique.

Thereafter, layers that eventually produce a spin valve film were formed. Firstly, a PtMn film, a CoFe film and an Al film were formed sequentially to respective thicknesses of 20 nm, 5 nm and 1 nm by means of a sputtering technique. Then, the layers were left in the atmosphere for 10 hours. As a result, the Al film layer became an $Al_2O_x$ film layer. Thereafter, a CoFe film and a Ta film were formed sequentially to respective thicknesses of 4 nm and 5 nm on the $Al_2O_x$ film by means of a sputtering technique.

Subsequently, the spin valve film was subjected to an etching process and an ion milling process to remove partly it at opposite ends and make the spin valve film show a predetermined profile.

Then, Co-$\gamma Fe_2O_3$ films were formed at the respective opposite ends of the spin valve film to a thickness of 30 nm by means of a DC sputtering system. The free layer could be satisfactorily stabilized when the Co-$\gamma Fe_2O_3$ films were made to show a thickness of 30 nm. An $Co_{20}Fe_{60}$ alloy was used as target and Ar-10% $O_2$ gas was used under pressure of 0.5 Pa as sputtering gas. High frequency power of 500 W was applied for the film forming operation.

Thereafter, a Ta film was formed to a thickness of 100 nm by means of a lift-off technique and then an $Al_2O_3$ film was formed in the areas other than the GMR element. As a result, it was possible to prevent short-circuiting from occurring in the magnetic shield layers. Then, a $Ni_{80}Fe_{20}$ film was formed to a thickness of 5 μm by means of a plating technique. Finally, the work was heat-treated at 270° C. in the atmosphere for an hour. As a result, the magnetic characteristics of the Co-$\gamma Fe_2O_3$ were remarkably improved.

A sense current was made to flow from the lower magnetic shield layer toward the upper magnetic shield layer of the GMR head to find that the sense current diverting to the bias layers had been remarkably reduced. Additionally, it was found that, since the free layer of the GMR thin film of a GMR head according to the invention shows a satisfactory single magnetic domain and can hardly give rise to any magnetic wall, the GMR head operates excellently for signal reproduction.

What is claimed is:

1. A magnetoresistive-effect element comprising:
   a magnetoresistive-effect thin film operating as a magnetism sensing section;
   a pair of hard magnetic layers formed respectively at opposite ends of said magnetoresistive-effect thin film and adapted to apply a bias magnetic field to said magnetoresistive-effect thin film;
   a pair of electrode layers formed oppositely on the main surfaces of the magnetoresistive-effect thin film and adapted to supply an electric current to said magnetoresistive-effect thin film; and
   a magnetization fixing layer formed as a lowermost layer of the magnetoresistive-effect thin film, said magnetization fixing layer including anti-ferromagnetic material, wherein
   said hard magnetic layers having an electric resistivity not lower than 0.5 Ωcm, and said anti-ferromagnetic material is made of RhMn, IrMn, PtMn, and NiMn.

2. The magnetoresistive-effect element according to claim 1, wherein said magnetoresistive-effect thin film shows a tunnel junction type magnetoresistive-effect.

3. The magnetoresistive-effect element according to claim 1, wherein said magnetoresistive-effect thin film shows a giant magnetoresistive-effect.

4. The magnetoresistive-effect element according to claim 1, wherein said hard magnetic layers are made of a material containing an oxide as principal ingredient.

5. The magnetoresistive-effect element according to claim 4, wherein said hard magnetic layers are made of a material containing $\gamma Fe_2O_3$ as principal ingredient.

6. The magnetoresistive-effect element according to claim 4, wherein said hard magnetic layers are made of a material containing Co-$\gamma Fe_2O_3$ as principal ingredient.

7. The magnetoresistive-effect element according to claim 1, wherein said hard magnetic layers are made of a material containing Co—Fe—$MgF_2$ as principal ingredient.

8. A magnetoresistive-effect element comprising: a magnetoresistive-effect thin film operating as a magnetism sensing section;
   a pair of hard magnetic layers formed respectively at opposite ends of said magnetoresistive-effect thin film and adapted to apply a bias magnetic field to said magnetoresistive-effect thin film, wherein said hard magnetic layers have an electric resistivity not lower than 0.5 Ωcm and make contact with at least an uppermost layer and a lowermost layer of said magnetoresistive-effect thin film;
   and a pair of electrode layers formed oppositely on the main surfaces of the magnetoresistive-effect thin film and adapted to supply an electric current to said magnetoresistive-effect thin film.

* * * * *